(12) United States Patent
Engelien-Lopes et al.

(10) Patent No.: US 10,461,713 B1
(45) Date of Patent: Oct. 29, 2019

(54) RADIO-FREQUENCY AMPLIFIER DEVICE

(71) Applicant: Nordic Semiconductor ASA, Trondheim (NO)

(72) Inventors: David Alexandre Engelien-Lopes, Trondheim (NO); Bartosz Gajda, Trondheim (NO); Kjetil Holstad, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 16/230,683

(22) Filed: Dec. 21, 2018

(51) Int. Cl.
*H03G 3/30* (2006.01)
*H03F 3/195* (2006.01)

(52) U.S. Cl.
CPC .......... *H03G 3/3042* (2013.01); *H03F 3/195* (2013.01); *H03G 3/3089* (2013.01)

(58) Field of Classification Search
CPC ....................................................... H03G 3/30
USPC ................................................ 330/278, 279
See application file for complete search history.

(56) References Cited

U.S. PATENT DOCUMENTS

| | | | | |
|---|---|---|---|---|
| 7,161,418 B2* | 1/2007 | Boos | .................... | H03G 3/3042 330/2 |
| 7,386,280 B2* | 6/2008 | Kappes | ................... | H03F 3/211 330/278 |
| 8,045,940 B2* | 10/2011 | Gohn | ....................... | H04B 1/28 455/130 |

OTHER PUBLICATIONS

Skyworks Solutions, Inc. Data Sheet: "SKY66112-11: 2.4 GHz ZigBee®/Thread/ Bluetooth® Smart Front-End Module," Mar. 14, 2017, 14 pages.
Texas Instruments Incorporated Specification Sheet, "CC2592 2.4-GHz Range Extender," Feb. 2014, 22 pages.

* cited by examiner

*Primary Examiner* — Henry Choe
(74) *Attorney, Agent, or Firm* — Klarquist Sparkman, LLP

(57) ABSTRACT

A radio-frequency (RF) amplifier device comprises a signal input for receiving an RF electrical signal, a variable-gain amplifier for amplifying the received signal, and a signal output for outputting the amplified signal. The device has a binary input for switching a gain of the amplifier between a first level and the custom gain level. Configuration logic receives serialised data encoding a custom gain level at a serial input, and stores data representative of the custom gain level in a memory of the device. Gain-control logic reads the data representative of the custom gain level from the memory, and sets the gain of the amplifier to the first level or to the custom gain level in dependence on a state of the binary input.

20 Claims, 5 Drawing Sheets

RADIO-FREQUENCY AMPLIFIER DEVICE

BACKGROUND OF THE INVENTION

This invention relates to methods and apparatus for amplifying a radio-frequency (RF) electrical signal.

In radio communication, amplifiers are commonly used to amplify an RF electrical signal. This may be done before the electrical signal is sent to an antenna to be transmitted as a radio signal, or after an incoming radio signal has been converted to an electrical signal by a radio antenna. An amplifier on a transmit path is commonly referred to as a power amplifier, while an amplifier on a receive path will typically be a low-noise amplifier. Amplifiers may be contained within an integrated radio transceiver module. They can also be provided in standalone integrated-circuit (IC) RF front-end modules.

Standalone front-end devices typically have an input for receiving an outgoing RF electrical signal from a separate radio transceiver device, and an output for providing the amplified outgoing RF signal to an off-chip antenna. They may also have an input for receiving an incoming RF electrical signal from an off-chip antenna, and an output for providing the amplified incoming RF electrical signal to the radio transceiver device. A separate front-end chip may be mounted on a common printed circuit board (PCB) with a radio transceiver chip, or may be integrated with a radio chip in a multi-chip module.

Standalone amplifier devices, or front-end devices, are sometimes used as optional range extenders for increasing the transmission and/or reception range of radio transceiver devices. Front-end devices may provide filtering and switching functions in addition to amplification.

Examples of front-end devices include the "CC2592 2.4-GHz Range Extender" from Texas Instruments™ and the "SKY66112-11 Front-End Module" from Skyworks™. These are both fully-integrated RF front-end module (FEM) for amplifying incoming and outgoing RF signals in the 2.4 GHz band, and may be used for applications such as ZigBee™ and Bluetooth Smart™.

Such devices can provide useful increases in range for radio-on-a-chip devices. However, the applicant has recognised that many conventional RF amplifier devices are not well suited to providing consistent or optimal amplification, especially under changing conditions.

The present invention therefore seeks to provide a better approach.

SUMMARY OF THE INVENTION

From a first aspect, the invention provides a radio-frequency (RF) amplifier device, comprising:
  a signal input for receiving an RF electrical signal;
  a variable-gain amplifier for amplifying the received RF electrical signal;
  a signal output for outputting the amplified RF electrical signal;
  a serial input for receiving serialised data encoding a custom gain level;
  a memory for storing data representative of the custom gain level;
  a binary input for switching the gain of the amplifier between a first level and the custom gain level;
  configuration logic configured to receive serialised data encoding the custom gain level at the serial input, and to store data representative of the custom gain level in the memory; and
  gain-control logic configured to read the data representative of the custom gain level from the memory, and to set the gain of the amplifier to the first level or to the custom gain level in dependence on a state of the binary input.

Thus it will be seen that, in accordance with the invention, the amplifier device can first be configured with a chosen gain level by writing a custom gain level to the device over the serial interface, and then this custom gain level can subsequently be selected, quickly and straightforwardly, by changing the logic state of the binary input, which may be a general-purpose input/output pad or pin.

This contrasts with devices such as the Texas Instruments™ CC2592 and the Skyworks™ SKY66112-11 which do not have a serial interface and which support only hardwired gain levels. The Texas Instruments™ CC2592 provides only a single, fixed, transmit gain, and a choice of two, fixed, receive gain levels ("high gain mode" and "low gain mode") which can be toggled by changing the logic state of an input pin. The Skyworks™ SKY66112-11 offers a choice of two, fixed, transmit power modes ("high-power" or "low-power"), which can be toggled by changing the logic state of an input pin, and a single, fixed, receive gain.

Embodiments of the present invention advantageously enable a customer to customise the gain of the amplifier device for a particular context, such as to match the device with a particular radio transceiver design or a particular antenna design, or to comply with particular geographical regulations concerning maximum power output, or to compensate for manufacturing variation between devices. Moreover, embodiments can provide this configurability while also providing the speed and simplicity of switching to or away from the custom gain level simply by changing the state of the binary input control.

In some embodiments, the variable-gain amplifier is a power amplifier. The device may be suitable for amplifying an electrical signal for transmission as a radio signal. The signal output may be configured to be connected to one or more antennas.

In some embodiments, the variable-gain amplifier is a low-noise amplifier. The device may be suitable for amplifying an electrical signal derived from a received radio signal. The signal input may be configured to be connected to one or more antennas.

The memory (e.g., a register) may be volatile (e.g., comprising flip-flops), but is preferably non-volatile. By storing the custom gain level in non-volatile memory, the level can be retained even when power is removed—e.g., during battery changes. Thus, for example, a system integrator may purchase a quantity of amplifier devices embodying the invention, calibrate each of them to determine respective custom gain levels for a particular context, and load the custom gain levels to all of the devices over the serial input. When the memory is non-volatile, this writing need only be performed once, during post-production, before shipping a finished product to customers. Thereafter, the calibrated gain level may remain stored on the device indefinitely, and is available to be selected through the binary input as required.

The variable-gain amplifier may support any number of gain settings—e.g., three, four, eight, sixteen, thirty-two, $2^{16}$ or $2^{32}$, or more. Each gain level may correspond to a different respective gain setting of the amplifier. For example, the gain level may be represented by a five-bit number and the amplifier may support thirty-two gain settings—i.e., supporting a different setting for each different gain level value. The gain level may be encoded as an integer from a set of integers, but the level does not necessarily correspond directly with the measurable gain of the amplifier—e.g., there may be only a linear correspondence, or there may be no correspondence at all. The correspondence may differ from one device to the next, even where the circuit design is the same, due to process or other manufacturing variation. The configuration logic may be configured to receive serialised data encoding a multi-bit gain level—i.e., a level value that is encoded on two or more bits.

The gain of the amplifier may be variable over a range of gain levels spanning at least 2, 3, 5 or 10 dB. The amplifier may support a first gain level of 10 dB or lower and may support a second gain level of 20 dB or higher. It may support any number of gain levels between these first and second gain levels and/or below the first gain level and/or above the second gain level. The gain may be variable, over some or all of a gain range, in steps having a maximum step size of at most 1 or 2 dB. For example, the gain may be configurable with a granularity of 1 dB or finer at least within the range dB to 20 dB. However, in other embodiments the step size may be more or less than 1 dB. The device may support a bypass mode in which the gain of the amplifier is 0 dB. The amplifier may support one or more negative gain levels, e.g., to provide damping to reduce or limit the output power.

The amplifier device may be an integrated-circuit device. In particular, the variable-gain amplifier, configuration logic and gain-control logic may be integrated—e.g., on a common semiconductor substrate. The signal input, serial input, binary input and signal output may comprise respective pads or pins on the device.

In some embodiments, the amplifier device does not contain circuitry for generating the RF electronic signal—e.g., for encoding and/or modulating an RF signal—and/or does not contain circuitry for demodulating the RF electronic signal. Some embodiments include no digital-to-analogue converter. Some embodiments include no mixer. The device may be a standalone front-end device. It may be a radio range extender. It may be a die, or may be a packaged integrated-circuit. The signal input, serial input and binary input may be external interfaces of the device (e.g., comprising one or more respective contact pads or pins). The amplifier device may be electrically coupled to an RF transmitter device that is configured to output an RF electrical signal to the amplifier device and/or to an RF receiver device that is configured to receive an RF electrical signal from the amplifier device. It may be electrically coupled by an electrical conductor that is external to the amplifier device—e.g., a conductor of a printed circuit board (PCB).

In other embodiments, however, it is possible that the amplifier device could be integrated with a radio transceiver. Thus, the amplifier device may comprise a radio-frequency transmitter or radio-frequency receiver—e.g., comprising a radio modem for modulating or demodulating an RF signal bearing digital data. The amplifier device may be a single integrated-circuit device comprising a radio transmitter and/or receiver. It may be radio-on-a-chip device. In this case, the signal input, serial input and binary input may be internal interfaces within the device (e.g., internal signal lines between respective functional units).

The amplifier device may comprise connections for connecting the amplifier device to two or more antennas—e.g., two or more signal inputs, or two or more signal outputs. It may comprise a switch for selecting between the two or more antennas—e.g., for selecting a single transmit or receive antenna to use at a time from a plurality of antennas.

From a further aspect, the invention provides a radio apparatus, comprising:
a radio-frequency (RF) amplifier device;
an RF transmitter or receiver device;
an electrical connection for transferring an RF electrical signal between the RF amplifier device and the RF transmitter or receiver device,
wherein the RF amplifier device comprises:
a signal input for receiving an RF electrical signal;
a variable-gain amplifier for amplifying the received RF electrical signal;
a signal output for outputting the amplified RF electrical signal;
a serial input for receiving serialised data encoding a custom gain level;
a memory for storing data representative of the custom gain level;
a binary input for switching the gain of the amplifier between a first level and the custom gain level;
configuration logic configured to receive serialised data encoding the custom gain level at the serial input, and to store data representative of the custom gain level in the memory; and
gain-control logic configured to read the data representative of the custom gain level from the memory, and to set the gain of the amplifier to the first level or to the custom gain level in dependence on a state of the binary input.

The RF transmitter or receiver device may be an RF transmitter device, or an RF receiver device, or an RF transceiver device. The signal input of the RF amplifier device may be connected to the RF transmitter or receiver device and the signal output may be connectable to an antenna. Alternatively, the signal input of the RF amplifier device may be connectable to an antenna and the signal output may be connected to the RF transmitter or receiver device. The amplifier device may be configured both to receive RF electrical signals from an RF transceiver device and to output amplified RF electrical signals to the RF transceiver device. The electrical connection may be bi-directional.

The radio apparatus may comprise a PCB to which the amplifier device and the RF transmitter or receiver device are bonded. The electrical connection may comprise a PCB track.

The radio apparatus may comprise a processing system, which may comprise a processor and a memory for storing software instructions for execution by the processor. The processing system may be located within the RF transmitter or receiver device, or within a separate processing device such as a microcontroller unit (MCU). The processing system may be configured to control the state of the binary input of the amplifier device, e.g., using software instructions executing on the processor. In some embodiments, the processing system may be configured to change the gain of the amplifier device, by changing the state of the binary input, in response to one or more conditions, such as determining that the apparatus is in a particular geographical area, or is configured to use a particular radio protocol. If the apparatus supports multiple antennas, the processing system may change the gain when switching between two or more antennas.

Alternatively, or additionally, the radio apparatus may comprise a mechanical switch for controlling the state of the binary input—e.g., a dual in-line package (DIP) switch on a PCB—or the binary input could be hardwired to logic one or logic zero.

The radio apparatus may comprise a serial connection between the amplifier device and the transmitter or receiver device. A processing system on the transmitter or receiver device may be configured to send serialised data, which may encode a custom gain level, to the serial input of the amplifier device. However, a serial connection to the RF transmitter or receiver device is not essential: in some embodiments, the serial input may be temporarily connected to an external apparatus for sending serialised data, encoding the custom gain level, to the amplifier device—e.g., during a post-production calibration process—and may remain disconnected during subsequent deployment. This may avoid the need for the RF transmitter or receiver device to have SPI pins altogether, and for the radio apparatus to comprise a serial connection; this could be advantageous in some situations (e.g., by reducing costs or the physical size of the radio apparatus). Thus, in some embodiments, the serial input is connected to test points on a PCB.

The radio apparatus may include one or more radio antennas (e.g., a plurality of antennas, which may provide greater diversity, directionality, etc.). In some embodiments, the amplifier device may comprise an internal radio antenna, in which case, the signal output for outputting the amplified RF electrical signal may be an internal output within the amplifier device. However, in some embodiments, the signal output is an external interface of the amplifier device (e.g., a contact pad or pin), for outputting the amplified RF electrical signal to an antenna or other external component. In some embodiments, the signal input is an external interface of the amplifier device (e.g., a contact pad or pin), for receiving the RF electrical signal from an antenna or other external component.

The amplifier device may comprise oscillators, baluns, inductors, switches, filters, etc.

The serial input of the amplifier device may comprise a plurality of pins for receiving incoming data and the serialised data encoding a custom gain level may be received over two or more pins or pads. However, in preferred embodiments, the serialised data encoding a custom gain level is received over a single pin or pad. The serial input may comprise a separate pin or pad for outgoing data. It may comprise a clock pin or pad. It may comprise a slave-select pin or pad. The serial input may be a Serial Peripheral Interface (SPI).

The memory may be rewriteable—e.g., RAM, flip-flops, flash or EEPROM memory. However, in a preferred set of embodiments it comprises one-time programmable (OTP) memory—e.g., electrically programmable fuse (eFUSE) memory. The use of OTP memory may be beneficial when it is desirable to configure the custom gain level only once, e.g., during a post-production tuning phase, for the life of the device; this may avoid a risk of the value being inadvertently or maliciously changed subsequently (e.g., by a user attempting, illegitimately, to increase the transmitter output power above a prescribed limit).

The binary input may be a pad or pin. It may be a general purpose input/output (GPIO) pin. It may be one of a plurality of binary inputs, whose logic states together determine the gain of the amplifier (optionally in combination with one or more other states, such as an internal state of the device). The gain-control logic may be configured to set the gain of the amplifier to the first level when the binary input has a first logic state (e.g., logic zero) and to set the gain of the amplifier to the stored gain level when the binary input has a second logic state (e.g., logic one). However, in some embodiments, the first binary input switches the gain between a first level and the custom gain level, when the gain-control logic, or the device more generally, is in a first state, but not when the gain-control logic, or the device more generally, is in a second state (e.g., when the device is actively amplifying a signal). In some device states, the binary input may perform a different function, or no function at all.

The first level may be constant, or it may depend on a state of the device—e.g., on the state of a further binary input or on the state of the gain-control logic. The first level may be another custom gain level, or it may be a non-configurable gain level.

In some embodiments, the configuration logic may be configured to receive serialised data encoding a second gain level at the serial input, and to store corresponding data representative of the second gain level in a second memory (e.g. a second register), which may be non-volatile. In such embodiments, the first level may, at least in some states, be said second gain level. The binary input may thus be used to switch conveniently between two custom gain levels. This may be useful, for example, when a device may need to be usable in two different countries or regions which have different maximum power output limits; the binary input enables the amplifier device to be straightforwardly toggled between the two stored levels as required—e.g., through software executing on a connected system-on-chip device, or by manual activation of a DIP switch on a PCB.

Some embodiments may be configured to store data representative of three or more custom gain levels, received at the serial input, in respective memories (which may be volatile, non-volatile rewriteable, or write-once). The device may comprise one or more further binary inputs, whose states may be used by the gain-control logic to set the gain of the amplifier—e.g., to select between three or more stored gain levels.

By enabling two or more custom gain levels to be configured through the serial input, and then selected through binary logic pins, embodiments can provide optimised gain settings for a variety of circumstances, while allowing straightforward and fast setting of a desired gain level after an initial configuration phase.

The amplifier device may support one or more non-configurable gain levels. It is preferably impossible for a customer to change these levels. The gain-control logic may be configured to set the gain of the amplifier to a non-configurable gain level in response to inputs received at the binary inputs. These non-configurable gain levels may be hardwired, or may be determined by data stored in one or more non-volatile memories. These memories may be read-only (ROM), or they may be one-time programmable memories to which data may be written during production—e.g., by the chip manufacturer. It will be appreciated that, typically, such levels will not be optimised for a particular set of end-use conditions, because these use conditions are determined by a system integrator or other customer and are not typically known by the chip manufacturer. Nevertheless, the provision of one or more default gain levels can provide additional flexibility—e.g., where configuring a gain level is not necessary or is not desirable. The device may comprise one or more further binary inputs that can be used to set the gain of the amplifier to a non-configurable gain level.

Embodiments that store the custom gain level in non-volatile memory may also be configured to receive data representative of a transient gain level over the serial input. They may store data representative of the transient gain level into a volatile memory. The transient gain level data may be lost if the device is reset or power cycled. The gain-control logic may be configured to set the gain of the amplifier to the transient gain level when one or more conditions are met, such as the device being in a particular state. In this way, the long-term stored gain level or levels may be overridden, at least on a temporary basis, by a gain level that is received over the serial input. This can provide greater flexibility for modifying the gain in the field—e.g., if an error is identified in the data in the one-time programmable memory, or if a new use case arises after the device is deployed.

In addition to providing the binary input for switching the gain of the amplifier between a first level and the custom gain level, some embodiments may enable the gain to be switched between a first level and the custom gain level in response to a command received over the serial input. In some embodiments, the binary input (and optionally one or more further binary inputs) is associated with a respective register which is writable over the serial input. The register may be a single-bit register. The device may be configured so that a change of state of the binary input causes a change to the value in the associated register. The device may be further configured so that a command over the serial input (e.g., a write command addressing the register) can cause a change to the value in the register. The gain-control logic may be configured to determine the state of the binary input by reading its associated register. In this way, both the binary input and the serial input can both be used to set the gain of the amplifier. This provides additional flexibility to the user of the device.

In some embodiments, the RF amplifier device may be configured for amplifying RF signals for radio transmission and for amplifying received radio signals. The RF amplifier device may comprise a first amplifier for amplifying signals on a transmit path and a second amplifier for amplifying signals on a receive path. The first amplifier may be a power amplifier. The second amplifier may be a low-noise amplifier. The first amplifier may be said variable-gain amplifier or the second amplifier may be said variable-gain amplifier. The device may comprise: a second variable-gain amplifier; a second memory for storing data representative of a second-amplifier custom gain level; and a second binary input for switching the gain of the second amplifier between a second-amplifier first level and the second-amplifier custom gain level. The configuration logic may be configured to receive serialised data encoding the second-amplifier custom gain level at the serial input, and to store data representative of the second-amplifier custom gain level in the second memory. The gain-control logic may be configured to read the data representative of the second-amplifier custom gain level from the second memory, and to set the gain of the second amplifier to the second-amplifier first level or to the second-amplifier custom gain level in dependence on a state of the second binary input The RF amplifier device may be used to provide automatic gain control. This may be done by the amplifier device alone changing the gain level, or it may be done in combination with the RF transmitter or receiver device.

The RF amplifier device may comprise a general-purpose processor for executing software instructions. However, in a preferred set of embodiments, the device comprises a hardware state machine and does not contain any general-purpose processor. The configuration logic and the gain-control logic are preferably implemented purely in hardware—e.g., using transistor-based logic gates. The device may comprise control logic which implements both the configuration logic and the gain-control logic.

Amplifier devices embodying the invention may be used in many different ways, some of which have already been exemplified above. In some applications, configuring the device and operating the device may be done at different times and by different actors.

From a further aspect, the invention provides a method of configuring a radio-frequency (RF) amplifier device, wherein the device comprises:
  a signal input for receiving an RF electrical signal;
  a variable-gain amplifier for amplifying the received RF electrical signal;
  a signal output for outputting the amplified RF electrical signal;
  a serial input for receiving serialised data encoding a custom gain level;
  a memory for storing data representative of the custom gain level;
  a binary input for switching the gain of the amplifier between a first level and the custom gain level;
  configuration logic configured to receive serialised data encoding the custom gain level at the serial input, and to store data representative of the custom gain level in the memory; and
  gain-control logic configured to read the data representative of the custom gain level from the memory, and to set the gain of the amplifier to the first level or to the custom gain level in dependence on a state of the binary input, the method comprising:
  inputting serialised data encoding a custom gain level to the serial input; and
  the configuration logic storing data representative of the custom gain level in the memory.

This method may be performed during a post-production configuration process—e.g., after a first sale of the amplifier device but before a first sale of a product that combines the amplifier device with a source of an RF electrical signal, such as a radio transceiver.

The method may further comprise measuring a strength of a radio signal arising from an amplified RF electrical signal output by the device. It may comprise determining the custom gain level based on a result of said measuring. The measuring may be performed on a first device embodying the invention, to determine a custom gain level, and the same determined custom gain level may be stored in one or more further devices embodying the invention.

From a further aspect, the invention provides a method of operating a radio-frequency (RF) amplifier device, wherein the device comprises:
  a signal input for receiving an RF electrical signal;
  a variable-gain amplifier for amplifying the received RF electrical signal;
  a signal output for outputting the amplified RF electrical signal;
  a serial input for receiving serialised data encoding a custom gain level;
  a memory for storing data representative of the custom gain level;
  a binary input for switching the gain of the amplifier between a first level and the custom gain level;
  configuration logic configured to receive serialised data encoding the custom gain level at the serial input, and to store data representative of the custom gain level in the memory; and
  gain-control logic configured to read the data representative of the custom gain level from the memory, and to set the gain of the amplifier to the first level or to the custom gain level in dependence on a state of the binary input, the method comprising:
  changing a state of the binary input; and
  the gain-control logic, in response to the changing of the state of the binary input, setting the gain of the amplifier to a custom gain level represented by data stored in the memory.

The gain-control logic may also read the data representative of the custom gain level from the memory in response to the change of state of the binary input. However, this is not essential, as the data in the memory may, for example, be read during a boot procedure and copied to a volatile register or used in some other way to prepare the amplifier to be set to the custom gain level ahead of the actual setting of the gain to the custom gain level.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain preferred embodiments of the invention will now be described, by way of example only, with reference to the accompanying drawings, in which.

DETAILED DESCRIPTION

Figure 1:
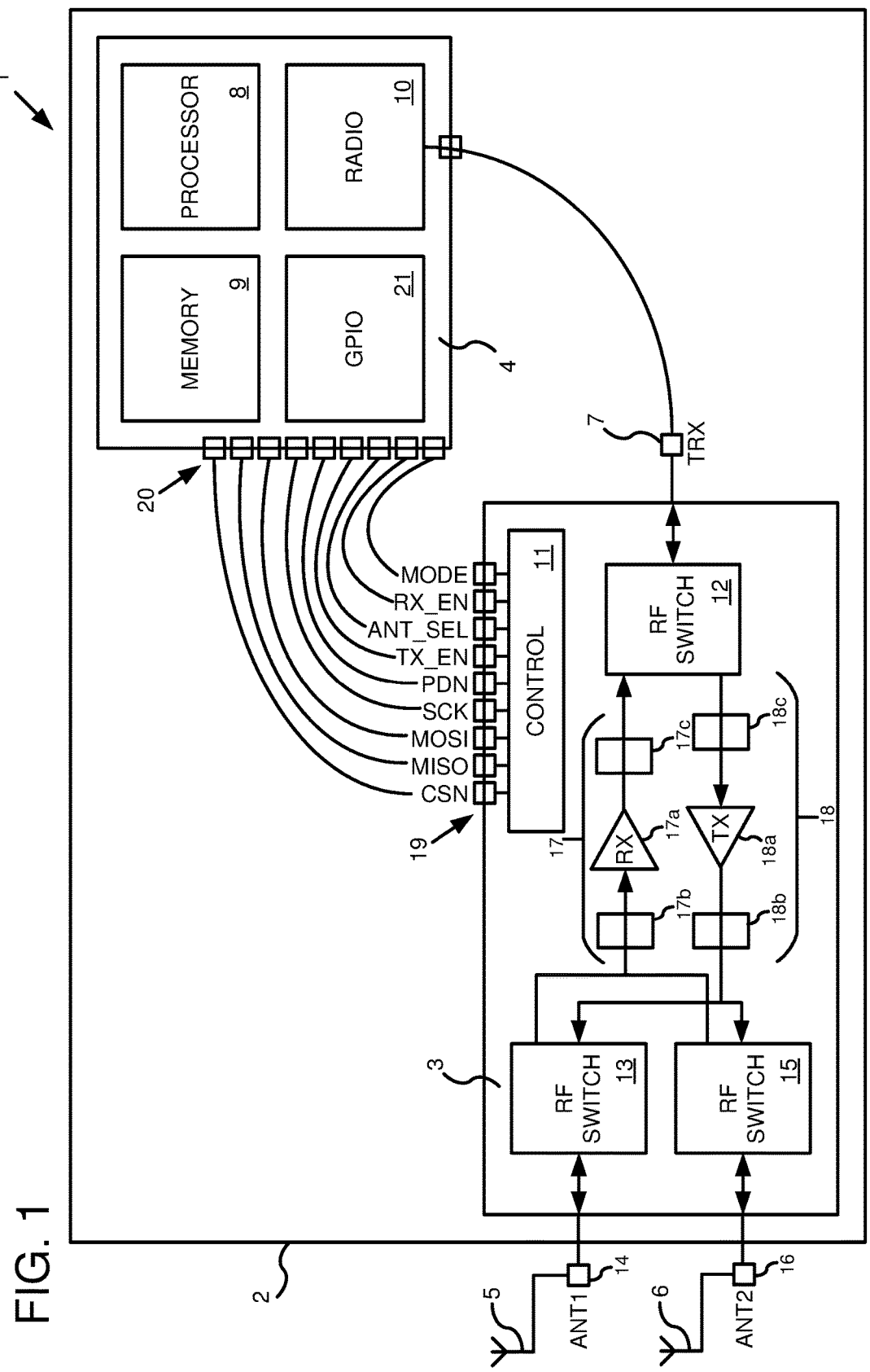
FIG. 1 is a schematic drawing of a radio apparatus embodying the invention.

FIG. 1 shows a radio apparatus 1 comprising of a printed circuit board (PCB) 2 on which are mounted an integrated-circuit range extender 3 and a radio-on-a-chip (RoC) 4. The range extender 3 is an amplifier device as disclosed herein. The RoC 4 is an RF transmitter and receiver device.

In addition to amplifying outgoing radio transmissions, the range extender 3 also contains a low-noise amplifier (LNA) for amplifying incoming radio signals. Thus the range extender 3 increases both the transmission range and the reception sensitivity of the RoC 4. Rather than connecting antennas 5, 6 directly to the RoC 4, two antennas 5, 6 are instead connected to respective RF signal outputs of the range extender 3. The RoC 4 sends outgoing RF electrical signals, over a PCB track, to a signal transmit/receive (TRX) input/output pin 7 of the range extender 3. The RoC 4 receives incoming RF electrical signals over the same track from the same pin 7.

In this embodiment, the range extender 3 and the RoC 4 are separately-packaged chips mounted on a PCB 2. It should be understood, however, that in other embodiments they could be integrated as a single semiconductor device.

The RoC 4 is a system-on-chip (SoC) device and comprises a processor (e.g., an ARM™ core) 8, memory 9 and a radio 10. The radio 10 includes analogue and digital circuitry for modulating and demodulating RF electrical signals. The memory 9 stores software for execution by the processor 8. The RoC 4 will also include other conventional components, such as buses, peripherals, oscillators, etc. which are omitted here for simplicity. The RoC 4 may support two-way communications using Bluetooth Low Energy™, Long-Term Evolution Cat-M1 (LTE-M), Narrowband-IoT (NB-IoT), or any other digital radio protocol. The RoC 4 may, on its own, have an output power of up to 8 dBm.

The range extender 3 comprises a control unit 11, implementing a hardware state machine. It also comprises a single-pole dual-throw (SPDT) RF switch 12, connected to the TRX pin 7, for selecting if TRX pin 7 is set for incoming or outgoing RF signals. A first further SPDT switch 13 is connected to a first antenna pin (ANT1) 14, leading to the first antenna 5, while a second further SPDT switch 15 is connected to a second antenna pin (ANT2) 16, leading to the first antenna 6. Each antenna 5, 6 can be switched between transmitting and receiving. One antenna 5, 6 is active at a time. When used for receiving, an antenna 5, 6 is connected to receive (RX) circuitry 17 in the range extender 3. When used for transmitting, an antenna 5, 6 is connected to transmit (RX) circuitry 18 in the range extender 3.

The receive circuitry 17 includes a LNA 17a and optionally one or more filters 17b, 17c.

The transmit circuitry 18 includes a variable-gain power amplifier 18a, as well as other optional components 18b, 18c that may include a transmit driver, baluns and filters. The power amplifier 18a supports thirty-two different amplification settings (which may include a 0 dB bypass setting and/or one or more negative damping settings).

The range extender has a set of nine GPIO pins 19, connected to the control unit 11, which are described in the following table.

| Pin | Description |
| --- | --- |
| MODE | Toggles the power-amplifier gain between the first and second preselected values |
| RX_EN | Enables receive mode |
| ANT_SEL | Selects between the two antenna interfaces 14, 16 |
| TX_EN | Enables transmit mode |
| PDN | Powers the device 3 up and down |
| SCK | SPI clock pin |
| MOSI | SPI in pin |
| MISO | SPI out pin |
| CSN | SPI chip select pin |

Each of the pins 19 is connected by a PCB track to a corresponding pin of a set of nine pins 20 on the RoC 4. A GPIO peripheral 21 on the RoC 4 supports control of the pins 20 by software executing on the processor 8. The GPIO peripheral 21 includes support for SPI communication.

The range extender 3 has other pins for power and ground connections, and for test purposes, which are omitted for simplicity. The radio apparatus 1 may also have other components, such as a power supply, crystal oscillators, and off-chip resistors, capacitors and inductors, some of which may be mounted on the PCB 2, or which may be separate from the PCB 2. These are omitted from FIG. 1 for simplicity.

The four pins SCK, MOSI, MISO and CSN provide a two-way SPI serial connection between the RoC 4 and the range extender 3.

Figure 2:
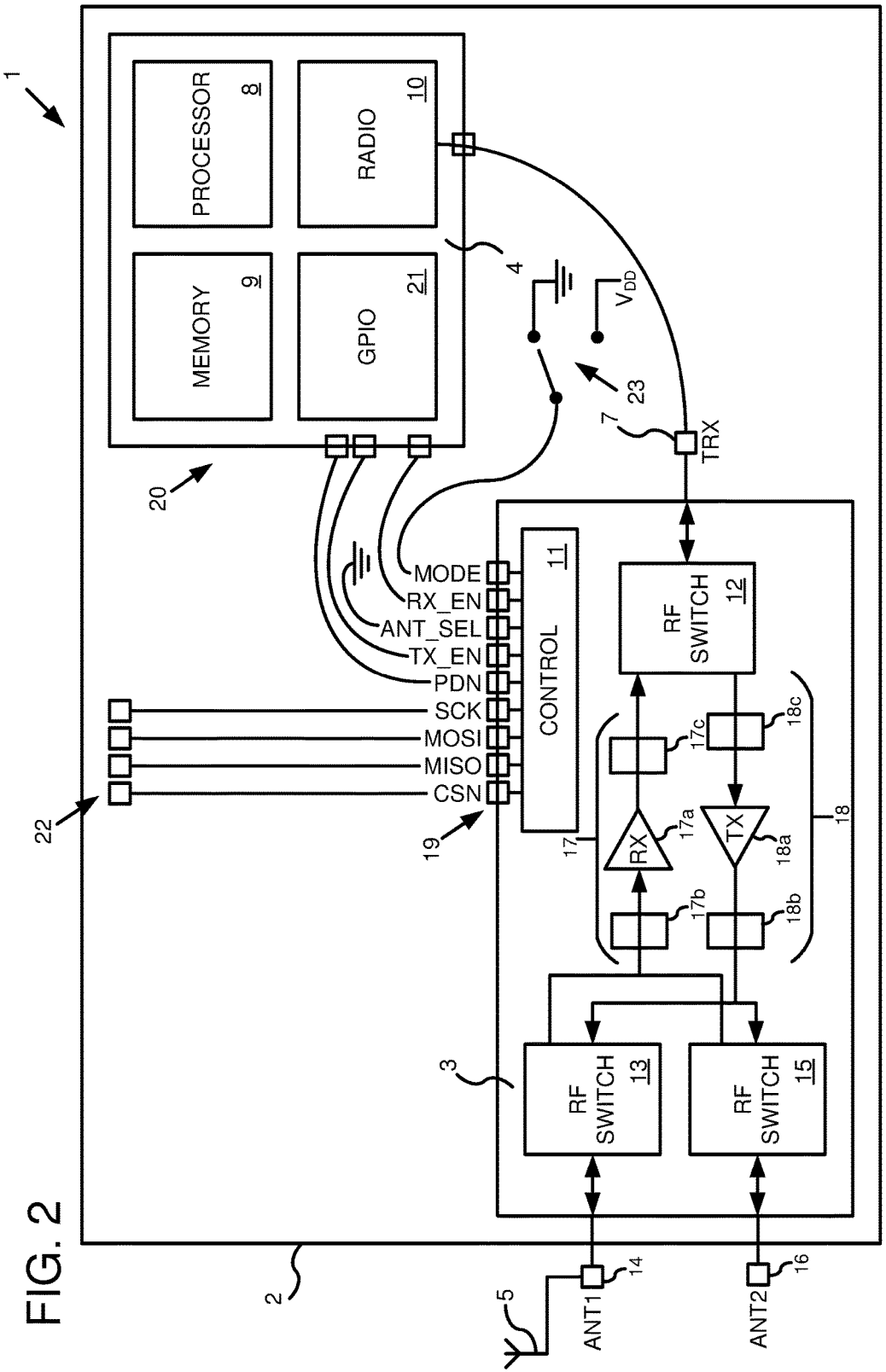
FIG. 2 is a schematic drawing of a variant radio apparatus embodying the invention.

FIG. 2 shows a variant embodiment, similar to FIG. 1, but in which there is no SPI serial connection between the RoC 4 and the range extender 3, and the serial pins of the range extender chip 3 are, instead, accessible via a set of test points 22, for external programming of the custom gain levels, as explained in more detail below. Also, in this variant, the MODE pin is not connected to the RoC 4 but is instead connected to a mechanical DIP switch 23 on the PCB 2, which allows a human to select a desired one of the custom gain levels (e.g., appropriate to national laws of the country to which the apparatus is being shipped). Also, the ANT_SEL pin is tied to ground so that the first antenna pin (ANT1) 14 is permanently selected, and no antenna is connected to the second antenna pin (ANT2) 16. These changes reduce the number of GPIO pins 20 on the RoC 4 by six down to three. Of course, some embodiments may implement only a subset of these variations.

Figure 3:
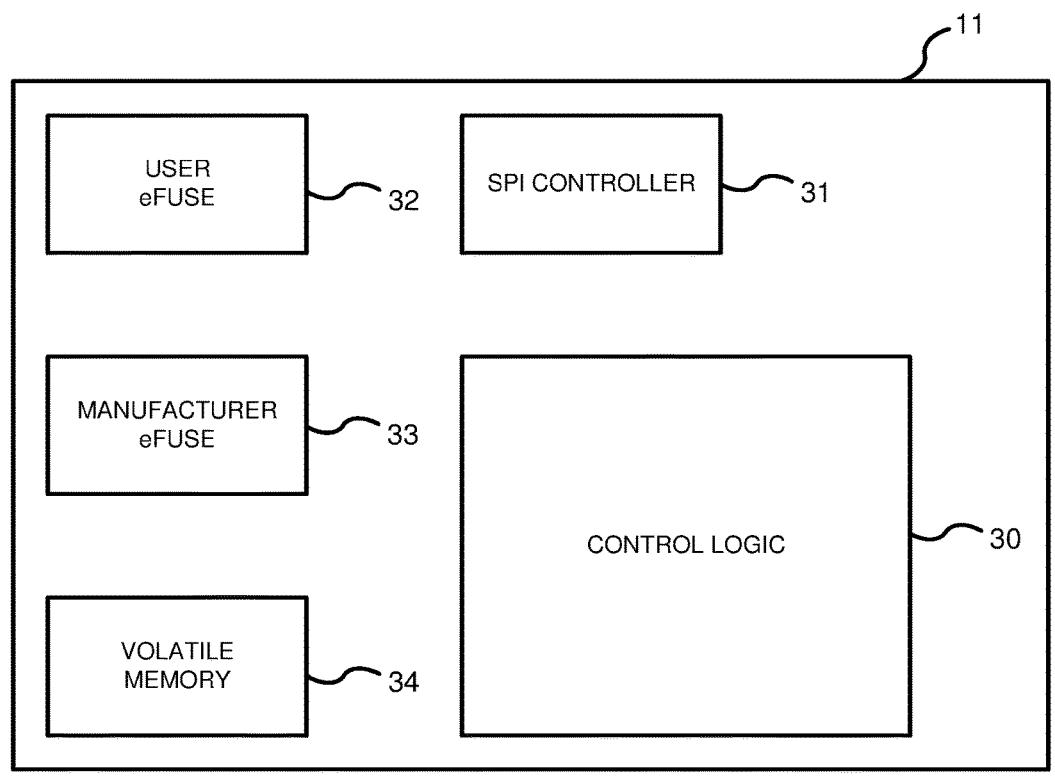
FIG. 3 is a schematic drawing of a control unit within the radio apparatus.

FIG. 3 shows more detail of the control unit 11, which includes control logic 30, a SPI controller 31, user-writeable OTP eFUSE memory 32, manufacturer-writeable OTP eFUSE memory 33, and volatile memory 34. These are represented schematically as blocks but, may of course, be distributed physically in any appropriate way across the chip 3.

The user eFUSE memory 32 comprises a first register for storing a first 5-bit custom gain level and a second register for storing a second 5-bit custom gain level.

The manufacturer eFUSE memory 33 comprises a first register for storing first 5-bit default gain level and a second register for storing a second 5-bit default gain level.

The volatile memory 34 comprises volatile bit-field registers (0x00 to 0x11) for receiving commands over the SPI interface.

The SPI controller 31 is located between the control logic 30 and the four SPI pins. It provides an interface to read and write registers in the volatile memory 34, which allows hardware and/or software on the RoC 4 to control certain operations of the range extender 3. It also provides write access to registers in the eFUSE memories 32, 33 and the volatile memory 34.

Each of the pins TX_EN, RX_EN and MODE has an associated single-bit register in the volatile memory 34 (labelled the same), which is writeable over the SPI interface.

This allows the same functionality to be accessed through either the GPIO pin or the SPI. The pin and SPI controls are logically OR'd.

The control logic 30 implements both the configuration logic and the gain-control logic disclosed herein, as well as other functions which are not relevant here.

The control logic 30 controls the switches 12, 13, 15 and other dynamic components of the range extender 3. Significantly, it controls the gain of the power amplifier 18a.

Figure 4:
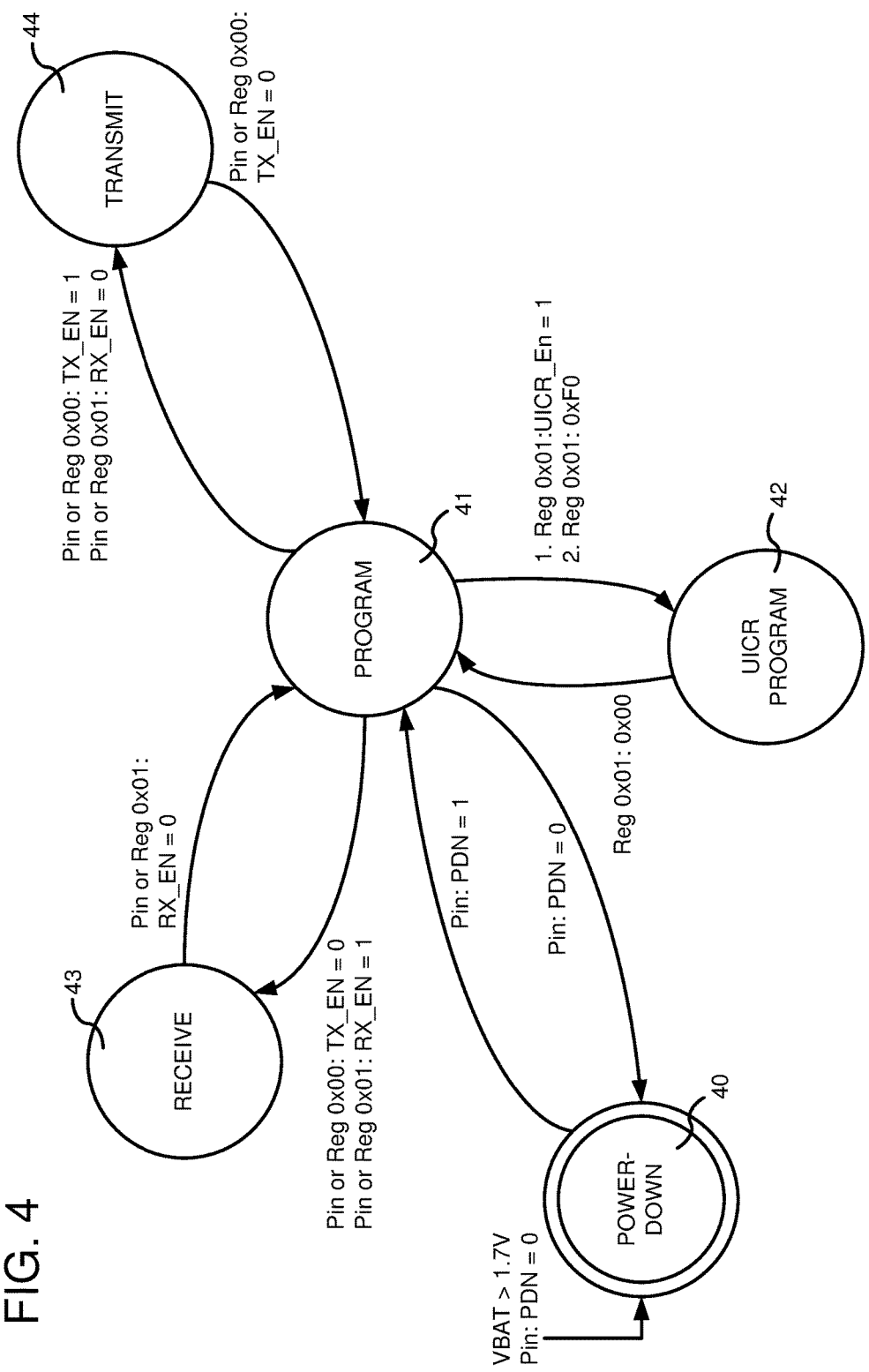
FIG. 4 is a state diagram for an amplifier device embodying the invention.

FIG. 4 is a state diagram for the control logic 30.

In a Power-Down state 40 the device 3 is powered down and all modules are disabled.

In a Program state 41, the device 3 can be configured and set to other states.

In a UICR (user information configuration register) Program state 42, user-defined custom values can be written to the user eFUSE memory 32 and volatile memory 34. In particular, first and second custom gain levels can be written (once) to the first and second registers in the user eFUSE memory 32. Also, each of two single-bit volatile registers in the volatile memory 34 can be written to for pre-selecting between the default and custom gain values. One register (POUTA_SEL=power out A select) pre-selects between the first default gain value and the first custom gain value. The other register (POUTB_SEL=power out B select) pre-selects between the second default gain value and the second custom gain value.

In a Receive state 43 the receive path through the receive circuitry 17 is enabled and the transmit path is deactivated.

In a Transmit state 44 the transmit path through the transmit circuitry 18 is enabled the receive path is deactivated.

Each of the other states can be entered from, and only from, the Program state 41. State transitions are controlled by pins PDN, RX_EN, and TX_EN and bit-fields in the SPI registers 0x00, 0x01, 0x04 and 0x05 in the volatile memory 34, as indicated in FIG. 4.

Once one or both user-writeable custom gain levels have been written to the user eFUSE registers 32, the RoC 4 can use the MODE pin, when the control unit is in the Program state 41, to select between the first and second preselected gain levels, where the first preselected gain level can either be the first default gain level or the first custom gain level, and where the second preselected gain level can either be the second default gain level or the second custom gain level. This is shown in the following table.

| MODE | POUTA_SEL | POUTB_SEL | Transmit Gain |
|---|---|---|---|
| 0 | 0 | — | Chip production first default value |
| 1 | — | 0 | Chip production second default value |
| 0 | 1 | — | User first custom value |
| 1 | — | 1 | User second custom value |

The output power in transmit (TX) mode can be configured using either pin control or the SPI interface. To configure TX output power through pins, MODE control from pin or register 0x00 can be used to set power control to one of two preset values.

The current transmit gain is stored in a register, TX_Gain, in the volatile memory 34. Preset values are initialized from eFUSE 32, 33 when waking up from power-down and these values are used to update the transmit gain (TX_Gain) value when MODE pin control changes in the Program mode 41. The initialization values can be those that are set in chip production calibration or they may be preset values that are written to registers in the user eFUSE memory 32.

The SPI interface can also be used to control TX power. In Transmit mode 44, TX gain is configured by writing the gain value over SPI directly to the register 0x00 TX_Gain field. An SPI write will always overwrite the initialization value.

During its lifetime, the range extender chip 3 will undergo a number of phases.

In a production phase, the chip manufacturer will perform some initial calibration, and store some tuning values to the manufacturer eFUSE memory 33. However, the first and second default gain levels will typically be set the same across all chips.

A system integrator will receive a batch of range extender chips 3 and integrate them with a RoC 4 and other components, on a PCB 2, and will connect the range extender 3 to one or more antennas 5, 6 and install it in a product (e.g., a wireless thermostat).

During a design phase for this integration, the system integrator will install a range extender chip 3 and will perform measurements on the strength of the radio signals transmitted by the antennas 5, 6. These will be used to calculate one or two custom transmit gain levels.

In a post-production phase for the batch of chips 3, the integrator will write the calculated custom values to the user eFUSE memory 33 of every range extender chip 3, over the SPI interface. The same custom gain level or levels may be written to every chip 3 in the batch (e.g., based on testing just one chip from the batch), or each chip 3 in the batch may be calibrated individually such that gain levels may differ from chip to chip. Individual calibration can allow the integrator to correct for product-to-product manufacturing variation in the products.

The custom gain levels may be written using an external SPI lead that is temporarily connected to the chip 3. In such cases, it may be possible, in some embodiments, not to have any SPI connection between the range extender chip 3 and the RoC 4, which may reduce costs. The RoC 4 need not then have any SPI pins. Alternatively, the RoC 4 of each apparatus 1 could be programmed with firmware that causes the RoC 4 to write the custom gain levels to the range extender chip 3 over the SPI connection the first time the radio apparatus 1 is powered on.

Once the custom gain levels have been stored in the eFUSE memory 33 of each chip 3, they cannot be changed.

After the apparatus is deployed, the transmit gain can be switched between any of the first default value, the first custom value, the second default value and the second custom value by the RoC 4 instructing appropriate writes over the SPI interface. However, switching between the first and second custom gain levels (or between the first and second default gain levels) can be performed more quickly by the RoC 4 simply toggling the state of the MODE pin.

In some embodiments, the gain of the LNA 17a in the receive circuitry 17 may also be variable. It may support one or more custom receive gain levels which can be configured over the SPI interface. The range extender chip 3 may provide one or more volatile registers for preselecting between two or more receive gain levels over the SPI interface. The chip 3 may be configured so that the MODE pin, or another pin, toggles between two receive gain levels (which could be default or custom levels) when the chip 3 is in the Receive state 43.

In some embodiments, the RoC 4 could switch between two different gain levels depending on which antenna 5, 6 is being used to transmit (or receive) a radio signal. The RoC 4 can conveniently do so simply by changing the state of the MODE pin.

Figure 5:
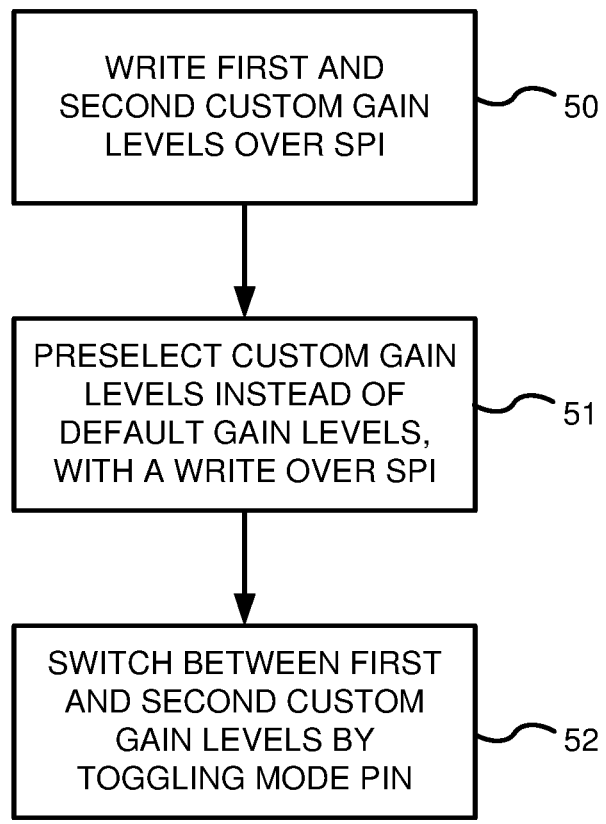
FIG. 5 is a flow chart of steps performed when configuring and operating an amplifier device according to the invention.

FIG. 5 summarises the steps carried out during post-production and deployment. In a configuration step 50, the RoC 4 writes the first and second custom gain levels to the user eFUSE register 32 over the SPI interface. In a preselection step 51, the RoC 4 sets the volatile POUTA_SEL bit register and the volatile POUTB_SEL bit register both to "1" to preselect the custom gain levels, rather than using the default gain levels. In a gain-switching step 52, the RoC 4 toggles the state of the MODE pin in order to toggle between the first and second custom gain levels, as required.

The following table of hypothetical data shows how custom gain levels may be used to ensure that the output power of instances of a radio apparatus design 1 can more accurately attain desired values—in this example, 10 dBm and 20 dBm. The manufacturer-set default gain levels in the range extender chips 3 are intended to provide these output powers, but are not necessarily accurate due to process and design variation and/or due to differences in the end products.

Data for three different radio apparatuses #1, #2, #3 are shown. The manufacturer's default gain levels in this example are set at "19" for 20 dBm output power, and "7" for dBm output power, for all three range extender chips 3. The corresponding output powers (Pout) are shown in the corresponding "Default Pout" columns. As can be seen, the manufacturer's calibration of the range extender chips 3 may be inaccurate and/or not suited for the particular end product setup, resulting in actual output powers that are not exactly 10 dBm and 20 dBm.

The user (e.g., integrator) can therefore perform a calibration on the whole apparatus 1, and store corrected custom gain levels on each chip 3, in order to bring the output powers to the desired levels in the end product setup 1. As can be seen in the table, the values in the user gain levels may typically vary from radio apparatus to radio apparatus, as shown by the differing values in the "User" columns. However, this user customisation allows the corresponding "User Pout" output power values more accurately to attain the desired values of 10 dBm and 20 dBm levels.

|    | Default @ 20 dBm | Default Pout @ 20 dBm | Default @ 10 dBm | Default Pout @ 10 dBm | User @ 20 dBm | User Pout @ 20 dBm | User @ 10 dBm | User Pout @ 10 dBm |
| --- | --- | --- | --- | --- | --- | --- | --- | --- |
| #1 | 19 | 21 dBm | 7 | 11 dBm | 18 | ~20 dBm | 6 | ~10 dBm |
| #2 | 19 | 18 dBm | 7 | 8 dBm | 22 | ~20 dBm | 9 | ~10 dBm |
| #3 | 19 | 19 dBm | 7 | 9 dBm | 20 | ~20 dBm | 8 | ~10 dBm |

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A radio-frequency (RF) amplifier device, comprising:
a signal input for receiving an RF electrical signal;
a variable-gain amplifier for amplifying the received RF electrical signal;
a signal output for outputting the amplified RF electrical signal;
a serial input for receiving serialised data encoding a custom gain level;
a memory for storing data representative of the custom gain level;
a binary input for switching a gain of the amplifier between a first level and the custom gain level;
configuration logic configured to receive serialised data encoding the custom gain level at the serial input, and to store data representative of the custom gain level in the memory; and
gain-control logic configured to read the data representative of the custom gain level from the memory, and to set the gain of the amplifier to the first level or to the custom gain level in dependence on a state of the binary input.

2. The RF amplifier device of claim 1, wherein the variable-gain amplifier is a power amplifier and wherein the RF amplifier device is configured for amplifying an RF electrical signal for transmission as a radio signal.

3. The RF amplifier device of claim 1, wherein the variable-gain amplifier is a low-noise amplifier and wherein the RF amplifier device is configured for amplifying an RF electrical signal derived from a received radio signal.

4. The RF amplifier device of claim 1, wherein the RF amplifier device is an integrated-circuit RF front-end device.

5. The RF amplifier device of claim 1, wherein the memory is non-volatile.

6. The RF amplifier device of claim 1, wherein the memory is one-time programmable memory.

7. The RF amplifier device of claim 1, wherein the variable-gain amplifier supports at least thirty-two different gain settings.

8. The RF amplifier device of claim 1, wherein the amplifier supports a gain level of 10 dB or lower and supports a gain level of 20 dB or higher.

9. The RF amplifier device of claim 1, wherein the signal input is an external input to the device, wherein the signal output is an external output from the device, and wherein the device does not contain any circuitry for modulating or de-modulating an RF signal.

10. The RF amplifier device of claim 1, wherein the serial input comprises a single pin or pad for receiving the serialised data encoding the custom gain level.

11. The RF amplifier device of claim 1, comprising a plurality of binary inputs, whose logic states together determine the gain of the amplifier.

12. The RF amplifier device of claim 1, wherein the first level is a second custom gain level, and wherein the configuration logic is configured to receive serialised data encoding the second custom gain level at the serial input, and to store corresponding data representative of the second custom gain level in a second memory of the RF amplifier device.

13. The RF amplifier device of claim 1, wherein the first level is a non-configurable gain level, and wherein the non-configurable gain level is determined by data stored in a non-volatile memory of the RF amplifier device by a manufacturer of the RF amplifier device.

14. A radio apparatus, comprising:
a radio-frequency (RF) amplifier device;
an RF transmitter or receiver device;
an electrical connection for transferring an RF electrical signal between the RF amplifier device and the RF transmitter or receiver device,
wherein the RF amplifier device comprises:
a signal input for receiving an RF electrical signal;
a variable-gain amplifier for amplifying the received RF electrical signal;
a signal output for outputting the amplified RF electrical signal;
a serial input for receiving serialised data encoding a custom gain level;
a memory for storing data representative of the custom gain level;
a binary input for switching the gain of the amplifier between a first level and the custom gain level;
configuration logic configured to receive serialised data encoding the custom gain level at the serial input, and to store data representative of the custom gain level in the memory; and
gain-control logic configured to read the data representative of the custom gain level from the memory, and to set the gain of the amplifier to the first level or to the custom gain level in dependence on a state of the binary input.

15. The radio apparatus of claim 14, wherein the RF amplifier device is a first integrated-circuit device, and wherein the RF transmitter or receiver device is a second integrated-circuit device, distinct from the RF amplifier device.

16. The radio apparatus of claim 14, comprising a printed circuit board (PCB), to which the RF amplifier device and the RF transmitter or receiver device are bonded.

17. The radio apparatus of claim 14, wherein the RF transmitter or receiver device comprises a processing system configured to control the gain of the amplifier by controlling the state of the binary input of the RF amplifier device.

18. The radio apparatus of claim 14, comprising a serial connection between the RF amplifier device and the RF transmitter or receiver device, wherein the RF transmitter or receiver device comprises a processing system configured to send said serialised data, encoding the custom gain level, to the serial input of the RF amplifier device.

19. A method performed on a radio-frequency (RF) amplifier device, wherein the RF amplifier device comprises:
a signal input for receiving an RF electrical signal;
a variable-gain amplifier for amplifying the received RF electrical signal;
a signal output for outputting the amplified RF electrical signal;
a serial input for receiving serialised data encoding a custom gain level;
a memory for storing data representative of the custom gain level;
a binary input for switching a gain of the amplifier between a first level and the custom gain level;
configuration logic configured to receive serialised data encoding the custom gain level at the serial input, and to store data representative of the custom gain level in the memory; and
gain-control logic configured to read the data representative of the custom gain level from the memory, and to set the gain of the amplifier to the first level or to the custom gain level in dependence on a state of the binary input,
the method comprising:
inputting serialised data encoding a custom gain level to the serial input; and
the configuration logic storing data representative of the custom gain level in the memory.

20. The method of claim 19, further comprising:
changing a state of the binary input; and
the gain-control logic, in response to the changing of the state of the binary input, setting the gain of the amplifier to the custom gain level represented by data stored in the memory.

* * * * *